US010079326B2

(12) United States Patent
Yeo et al.

(10) Patent No.: US 10,079,326 B2
(45) Date of Patent: Sep. 18, 2018

(54) OPTICAL SENSOR AND METHOD OF MANUFACTURE

(71) Applicant: SAMSUNG DISPLAY CO., LTD., Yongin-si, Gyeonggi-do (KR)

(72) Inventors: Yun Jong Yeo, Seoul (KR); Jung Ha Son, Seoul (KR); Joo Hyung Lee, Seongnam-si (KR)

(73) Assignee: Samsung Display Co. Ltd. (KR)

( * ) Notice: Subject to any disclaimer, the term of this patent is extended or adjusted under 35 U.S.C. 154(b) by 0 days.

(21) Appl. No.: 15/061,852

(22) Filed: Mar. 4, 2016

(65) Prior Publication Data
US 2016/0300974 A1    Oct. 13, 2016

(30) Foreign Application Priority Data

Apr. 9, 2015    (KR) .......................... 10-2015-0050426

(51) Int. Cl.
*H01L 31/113*    (2006.01)
*H01L 31/0216*    (2014.01)
(Continued)

(52) U.S. Cl.
CPC ........ *H01L 31/1136* (2013.01); *G02F 1/1362* (2013.01); *G06F 3/0412* (2013.01);
(Continued)

(58) Field of Classification Search
None
See application file for complete search history.

(56) References Cited

U.S. PATENT DOCUMENTS 8,450,740 B2    5/2013    Kim et al.
8,598,587 B2    12/2013    Yeo et al.
(Continued)

FOREIGN PATENT DOCUMENTS

CN    102141862 A    8/2011
CN    102609137 A    7/2012
(Continued)

OTHER PUBLICATIONS

Seongpil Chang et al., "Photo-Insensitive Amorphous Oxide Thin-Film Transistor Integrated with a Plasmonic Filter for Transparent Electronics," Advanced Functional Materials, Jun. 18, 2014, pp. 3482-3487, vol. 24.

(Continued)

*Primary Examiner* — Abul Kalam
(74) *Attorney, Agent, or Firm* — Innovation Counsel LLP

(57) ABSTRACT

An exemplary embodiment of the present invention provides an optical sensor, including: a substrate; an infrared ray sensing thin film transistor including a first semiconductor layer that is formed on the substrate and arranged to operate by receiving infrared light, and a bandpass filter formed on the substrate and sized and arranged to pass the infrared light; a visible ray sensing thin film transistor including a second semiconductor layer formed on the substrate and arranged to operate by receiving visible light; and a switching thin film transistor including a third semiconductor layer formed on the substrate, wherein the bandpass filter may be formed of a metal material patterned to have features, successive features spaced apart from each other by a predetermined period so as to pass the infrared light and to block the visible light.

10 Claims, 15 Drawing Sheets

(51) Int. Cl.
  *H01L 31/0376* (2006.01)
  *H01L 31/0224* (2006.01)
  *H01L 29/786* (2006.01)
  *H01L 31/20* (2006.01)
  *G02F 1/1362* (2006.01)
  *G06F 3/041* (2006.01)
  *G06F 3/042* (2006.01)
  *G02F 1/133* (2006.01)

(52) U.S. Cl.
  CPC ...... *G06F 3/0421* (2013.01); *H01L 29/78648* (2013.01); *H01L 31/02162* (2013.01); *H01L 31/022408* (2013.01); *H01L 31/03765* (2013.01); *H01L 31/204* (2013.01); *G02F 2001/13312* (2013.01); *G06F 2203/04103* (2013.01)

(56) References Cited

U.S. PATENT DOCUMENTS

| | | | |
|---|---|---|---|
| 8,698,167 B2 | 4/2014 | Kim et al. | |
| 8,796,626 B2 | 8/2014 | Han et al. | |
| 8,901,691 B2 | 12/2014 | Yeo et al. | |
| 2011/0234536 A1 | 9/2011 | Yeo et al. | |
| 2012/0188204 A1 | 7/2012 | Yeo et al. | |
| 2013/0214279 A1* | 8/2013 | Nishimura | G02F 1/13338 257/59 |
| 2014/0175441 A1* | 6/2014 | Chin | H01L 27/1218 257/53 |
| 2015/0002843 A1* | 1/2015 | Yokogawa | G01J 3/0205 356/303 |
| 2015/0287752 A1 | 10/2015 | Yeo et al. | |

FOREIGN PATENT DOCUMENTS

| | | |
|---|---|---|
| CN | 104978080 A | 10/2015 |
| EP | 2479655 A2 | 7/2012 |
| JP | 2012-155701 A | 8/2012 |
| JP | 2015-201647 A | 11/2015 |
| KR | 10-2011-0044431 A | 4/2011 |
| KR | 10-2011-0089914 A | 8/2011 |
| KR | 10-2012-0015668 A | 2/2012 |
| KR | 10-2012-0060407 A | 6/2012 |
| KR | 10-2012-0062501 A | 6/2012 |
| KR | 10-2012-0084995 A | 7/2012 |
| KR | 10-2012-0102909 A | 9/2012 |
| KR | 10-2012-0111637 A | 10/2012 |
| KR | 10-2014-0022843 A | 2/2014 |
| KR | 10-2014-0131526 A | 11/2014 |
| KR | 10-2015-0116975 A | 10/2015 |

OTHER PUBLICATIONS

Jana Olson et al., "Vivid, Full-Color Aluminum Plasmonic Pixels," PNAS, Oct. 7, 2014, pp. 14348-14353, vol. 111, No. 40.

* cited by examiner

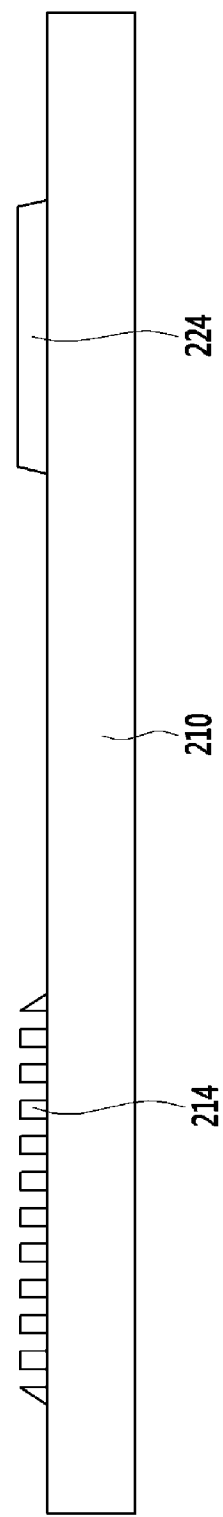

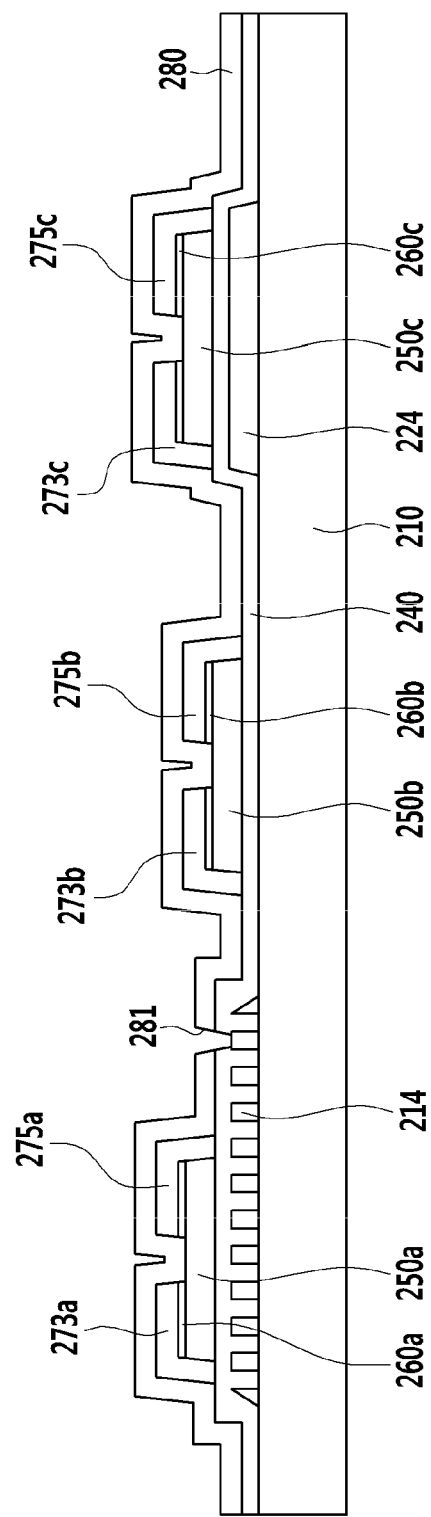

OPTICAL SENSOR AND METHOD OF MANUFACTURE

CROSS-REFERENCE TO RELATED APPLICATION

This application claims priority to, and the benefit of, Korean Patent Application No. 10-2015-0050426 filed in the Korean Intellectual Property Office on Apr. 9, 2015, the entire contents of which are incorporated herein by reference.

BACKGROUND

(a) Field of the Invention

Embodiments of the present invention relate generally to optical sensors and their manufacture. More particularly, embodiments of the present invention relate to optical sensors and improved manufacturing processes therefor.

(b) Description of the Related Art

Presently one of the most widely used flat panel displays, a liquid crystal display (LCD), includes two display panels formed with electrodes, and a liquid crystal layer interposed therebetween. The LCD controls an amount of light to be transmitted, by applying signals to the electrodes to realign liquid crystal molecules of the liquid crystal layer.

Recently, research on liquid crystal displays additionally having a touch sensing function or an image sensing function has been undertaken. To realize the touch sensing function and the image sensing function, the liquid crystal display may additionally include an optical sensor that includes an infrared ray sensing thin film transistor, a visible ray sensing thin film transistor, and a switching thin film transistor.

However, if the infrared ray sensing thin film transistor reacts to visible rays and the like in addition to infrared rays, a malfunction of the optical sensor may occur.

The above information disclosed in this Background section is only to enhance the understanding of the background of the invention and therefore it may contain information that does not form the prior art that is already known in this country to a person of ordinary skill in the art.

SUMMARY

Embodiments of the present invention provide an optical sensor and method of manufacture that can prevent visible rays from falling incident upon an infrared ray sensing thin film transistor, by providing a filter that passes only light of an infrared wavelength.

Further, embodiments of the present invention provide an optical sensor and manufacturing method that can reduce manufacturing costs by simplifying manufacturing processes thereof.

An exemplary embodiment of the present invention provides an optical sensor, including: a substrate; an infrared ray sensing thin film transistor including a first semiconductor layer that is formed on the substrate and arranged to operate by receiving infrared light, and a bandpass filter formed on the substrate and sized and arranged to pass the infrared light; a visible ray sensing thin film transistor including a second semiconductor layer formed on the substrate and arranged to operate by receiving visible light; and a switching thin film transistor including a third semiconductor layer formed on the substrate. The bandpass filter may comprise a metal material patterned to have features, successive features spaced apart from each other by a predetermined period so as to pass the infrared light and to block the visible light.

The metal layer may comprise aluminum, molybdenum, copper, gold, silver, or chromium; the features may be holes, and the holes may be shaped as at least one of a circle, a quadrangle, a polygon, or a slit; and adjacent holes may be spaced apart from each other by about 390 nm to about 460 nm.

The bandpass filter may comprise metal particles positioned on the substrate.

The metal particle may include one of aluminum, molybdenum, copper, gold, silver, and chromium; the metal particles may have cross-sections shaped as at least one of a circle, a square, and a rectangle; and adjacent metal particles may be spaced apart from each other by about 390 nm to about 460 nm.

The first semiconductor layer may include amorphous silicon germanium.

The infrared ray sensing thin film transistor may include an ohmic contact layer formed on the first semiconductor layer; a source electrode and a drain electrode formed on the ohmic contact layer; an insulating layer formed on the source electrode and the drain electrode; a contact hole formed in the insulating layer to expose the bandpass filter; and an upper gate electrode formed on the insulating layer to be connected to the bandpass filter through the contact hole.

The second semiconductor layer and the third semiconductor layer may include amorphous silicon.

The visible ray sensing thin film transistor may include an ohmic contact layer formed on the second semiconductor layer; a source electrode and a drain electrode formed on the ohmic contact layer; an insulating layer formed on the source electrode and the drain electrode; and an upper gate electrode formed on the insulating layer.

The switching thin film transistor may include a lower gate electrode formed on the substrate; a first insulating layer formed on the lower gate electrode; an ohmic contact layer formed on the third semiconductor layer; a source electrode and a drain electrode formed on the ohmic contact layer; a second insulating layer formed on the source electrode and the drain electrode; and an upper gate electrode formed on the second insulating layer.

Another embodiment of the present invention provides a method of manufacturing an optical sensor that includes an infrared ray sensing thin film transistor having a first semiconductor layer and a bandpass filter, a visible ray thin film transistor including a second semiconductor layer, and a switching thin film transistor including a third semiconductor layer, the method including: forming the bandpass filter by forming a pattern of features on a substrate, successive features spaced apart from each other by a distance equal to or less than a wavelength having a predetermined period; forming the second semiconductor layer and the third semiconductor layer on the substrate; forming a second ohmic contact layer and a third ohmic contact layer on the second semiconductor layer and the third semiconductor layer, respectively; forming a first insulating layer on the substrate; and forming the first semiconductor layer on the first insulating layer, and a first ohmic contact layer on the first semiconductor layer.

The forming of the bandpass filter may include preparing a metal layer; and forming a plurality of holes in the metal layer.

The forming of the plurality of holes in the metal layer may include forming the plurality of holes so that successive holes are spaced apart from each other by about 390 nm to about 460 nm.

The forming of the bandpass filter may include forming a photosensitive film on the metal layer; forming a photosensitive film pattern by selectively patterning the photosensitive film through a photolithography process; and forming the plurality of holes by selectively patterning the metal layer below the photosensitive film pattern using the photosensitive film pattern as a mask.

The forming of the bandpass filter may include forming a resist on the metal layer; forming a resist pattern by imprinting the resist with a molded-type roller; and forming the plurality of holes by selectively patterning the metal layer below the resist pattern using the resist pattern as a mask.

The forming of the bandpass filter may include arranging metal particles on the substrate.

The arranging of the metal particles may include arranging the metal particles so that an interval between adjacent metal particles is from about 390 nm to about 460 nm.

The manufacturing method of the optical sensor may further include forming a first source electrode and a first drain electrode on the first ohmic contact layer, a second source electrode and a second drain electrode on the second ohmic contact layer, and a third source electrode and a third drain electrode on the third ohmic contact layer, respectively; forming a second insulating layer on the first source electrode, the first drain electrode, the second source electrode, the second drain electrode, the third source electrode, and the third drain electrode; and respectively forming, on the second insulating layer, a first upper gate electrode to correspond to the first source electrode and the first drain electrode, a second upper gate electrode to correspond to the second source electrode and the second drain electrode, and a third upper gate electrode to correspond to the third source electrode and the third drain electrode.

According to exemplary embodiments of the present invention, it is possible to form a bandpass filter below a thin film transistor semiconductor layer for sensing infrared rays so that the optical sensor may prevent visible rays from being incident thereto, thereby preventing a malfunction thereof.

According to exemplary embodiments of the present invention, it is possible to form a bandpass filter including a plurality of holes that are formed on the metal layer, and to adjust the interval between the holes and the shape of the holes, so that the optical sensor may perform more accurate filtering than a filter that simply uses the properties of a material.

According to exemplary embodiments of the present invention, it is possible to form a bandpass filter and a lower gate electrode on the same surface, and to form the bandpass filter and the lower gate electrode with the same material, so that the optical sensor may simplify manufacturing processes and may reduce manufacturing costs.

BRIEF DESCRIPTION OF THE DRAWINGS

FIGS. 10A to 10F are cross-sectional views illustrating a method of manufacturing an optical sensor according to an exemplary embodiment of the present invention.

DETAILED DESCRIPTION OF THE EMBODIMENTS

Figure 1:
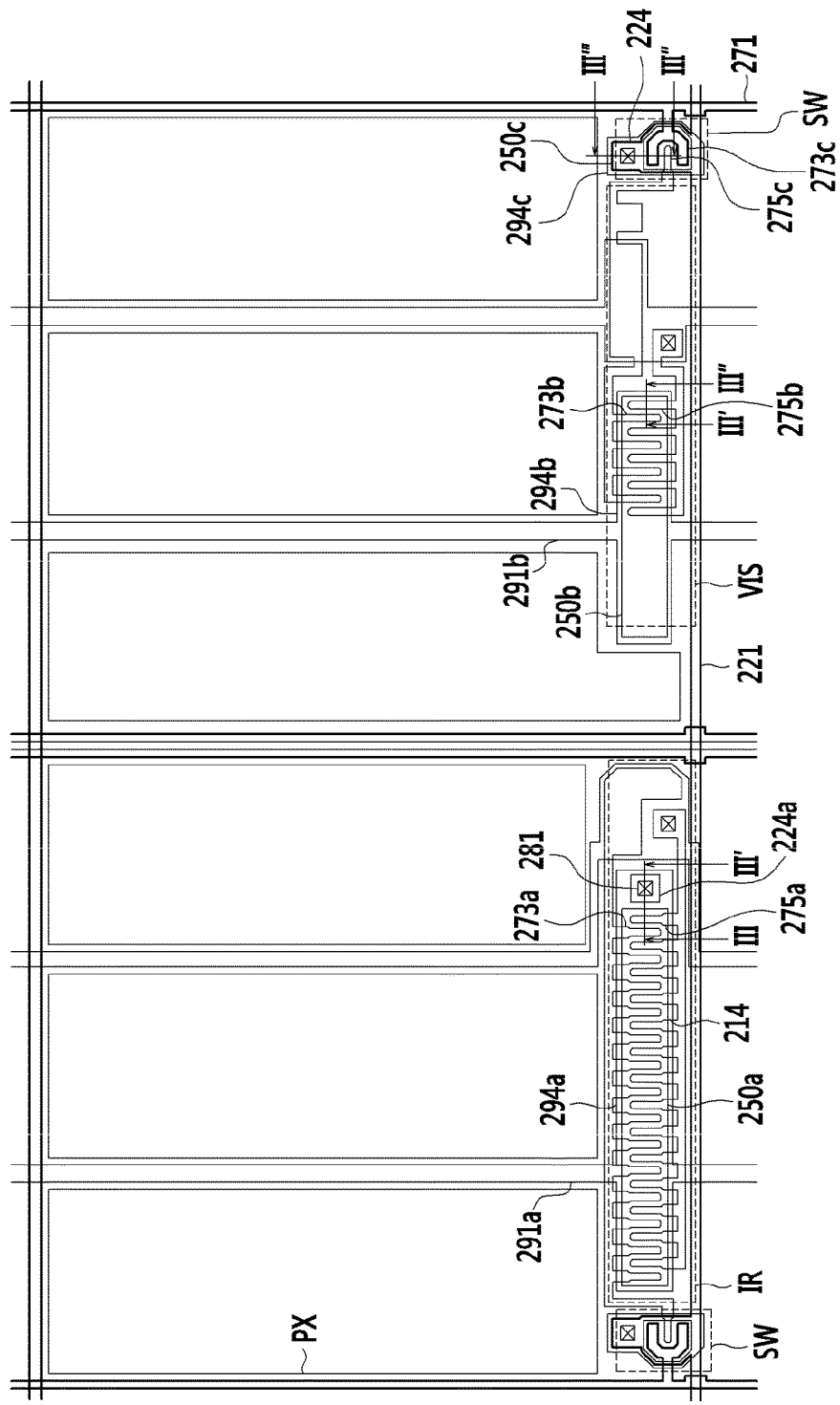
FIG. 1 is a plan view of an optical sensor according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. The various Figures are thus not to scale. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

All numerical values are approximate, and may vary. All examples of specific materials and compositions are to be taken as nonlimiting and exemplary only. Other suitable materials and compositions may be used instead.

First, an optical sensor according to an exemplary embodiment of the present invention will be described with reference to the accompanying drawings.

Figure 2:
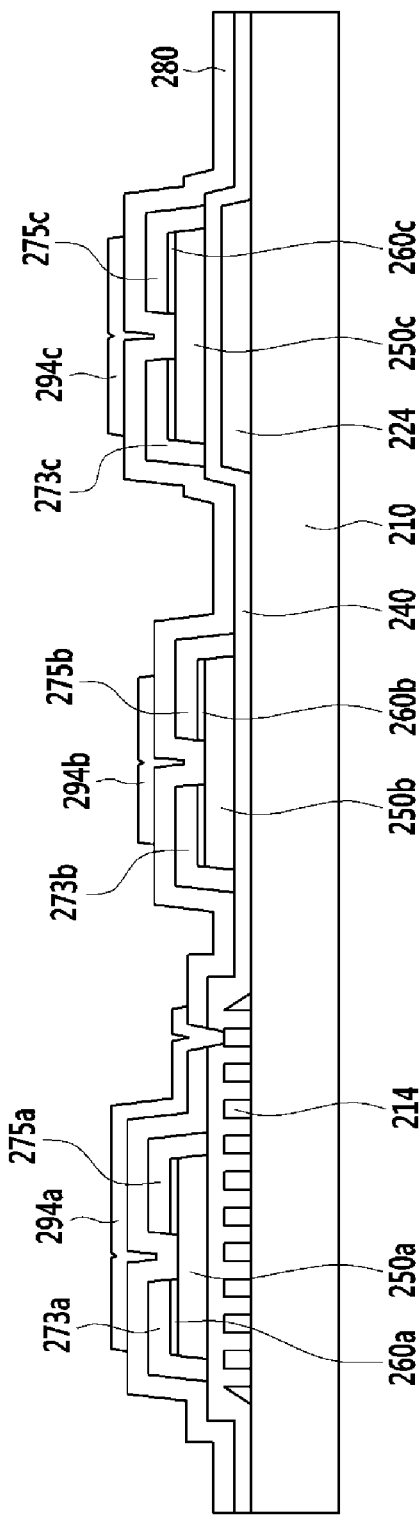
FIG. 2 is a cross-sectional view of an optical sensor according to an exemplary embodiment of the present invention taken along line VII-VII' of FIG. 1.

FIG. 1 is a plan view of an optical sensor according to an exemplary embodiment of the present invention, and FIG. 2 is a cross-sectional view of an optical sensor according to an exemplary embodiment of the present invention taken along line VII-VII' of FIG. 1.

An optical sensor according to an exemplary embodiment of the present invention includes a substrate 210 made of a transparent glass or plastic material, a plurality of gate lines 221 and data lines 271 formed to cross each other on the substrate 210, a switching thin film transistor SW connected to the gate line 221 and the data line 271, and an infrared ray sensing thin film transistor IR and a visible ray sensing thin film transistor VIS that are connected to the switching thin film transistor SW.

The gate lines 221 and the data lines 271 may define a plurality of pixels. One switching thin film transistor SW and one infrared ray sensing thin film transistor IR may be formed to be connected to each other in one pixel, and one switching thin film transistor SW and one visible ray sensing thin film transistor VIS may be formed to be connected to each other in another pixel that is adjacent thereto. That is, the infrared ray sensing thin film transistors IR and the visible ray sensing thin film transistors VIS may be placed in alternating pixels.

The infrared ray sensing thin film transistor IR includes a bandpass filter 214 formed on the substrate 210, a first semiconductor layer 250a formed on the bandpass filter 214, a first ohmic contact layer 260a formed on the first semiconductor layer 250a, a first source electrode 273a and a first drain electrode 275a that are formed on the first ohmic contact layer 260a, a fourth insulating layer 280 formed on the first source electrode 273a and the first drain electrode 275a, and a first upper gate electrode 294a formed on the fourth insulating layer 280.

The bandpass filter 214 prevents visible light rays from being incident to the first semiconductor layer 250a. Since the first semiconductor layer 250a has high quantum efficiency in a visible ray region as well as in an infrared region, it is affected by visible rays, and thus it is desirable to prevent visible rays from being incident to the first semiconductor layer 250a. The bandpass filter 214 may be formed by forming a linear or other pattern on a metal layer so that light of a specific wavelength may be selectively transmitted therethrough. In particular, the pattern may be sized and shaped such that light of the infrared wavelength may selectively pass therethrough.

The bandpass filter 214 according to the present exemplary embodiment may be formed by including a plurality of holes on the metal layer, or it may be formed by arranging rod-shaped metal particles or bar-shaped metal particles on the substrate 210.

The first semiconductor layer 250a may be formed of amorphous silicon germanium (a-SiGe). Amorphous silicon germanium (a-SiGe) is a material that has high quantum efficiency in an infrared region. In this case, the first semiconductor layer 250a may be formed of other materials other than amorphous silicon germanium (a-SiGe), and furthermore it may be formed of any material that may have high quantum efficiency in the infrared region.

The first source electrode 273a and the first drain electrode 275a are spaced apart from each other to form a channel. The first ohmic contact layer 260a is formed on the first semiconductor layer 250a, except for the area of the channel.

The infrared ray sensing thin film transistor IR is formed by being stacked on the substrate 210, and it may further include a first insulating layer (not shown) disposed below the bandpass filter 214 and a second insulating layer 240 disposed on the bandpass filter 214.

The first insulating layer (not shown) may be formed of a silicon nitride (SiNx), and it serves to improve adherence between the substrate 210 and the bandpass filter 214.

The second insulating layer 240 may be made of a silicon nitride (SiNx), and it may be formed between the bandpass filter 214 and the first semiconductor layer 250a so that an interface characteristic therebetween may be improved.

The visible ray sensing thin film transistor VIS includes a second semiconductor layer 250b formed on the substrate 210, a second ohmic contact layer 260b formed on the second semiconductor layer 250b, a second source electrode 273b and a second drain electrode 275b formed on the second ohmic contact layer 260b, a fourth insulating layer 280 formed on the second source electrode 273b and the second drain electrode 275b, and a second upper gate electrode 294b formed on the fourth insulating layer 280.

The second semiconductor layer 250b may be formed of amorphous silicon (a-Si). Since amorphous silicon (a-Si) is a material that has high quantum efficiency in a visible ray region, even though infrared light is incident thereto along with light of the visible ray region, it still has high sensitivity in the visible ray region. In this case, the second semiconductor layer 250b may be formed of other materials than the amorphous silicon (a-Si), and furthermore may be formed of any material that may have high quantum efficiency in the visible ray region.

The second source electrode 273b and the second drain electrode 275b are spaced apart from each other to form a channel. The second ohmic contact layer 260b is formed on the second semiconductor layer 250b, except for the area of the channel.

The switching thin film transistor SW includes a third semiconductor layer 250c formed on the substrate 210, a third ohmic contact layer 260c formed on the third semiconductor layer 250c, a third source electrode 273c and a third drain electrode 275c formed on the third ohmic contact layer 260c, a fourth insulating layer 280 formed on the third source electrode 273c and third drain electrode 275c, and a third upper gate electrode 294c formed on the fourth insulating layer 280.

The third semiconductor layer 250c may be formed of amorphous silicon (a-Si).

The third source electrode 273c and the third drain electrode 275c are spaced apart from each other to form a channel. The third ohmic contact layer 260c is formed on the third semiconductor layer 250c, except for the area of the channel.

The third source electrode 273c is connected to the data line 271 to receive a data voltage from the data line 271.

The third drain electrode 275c is connected to the first source electrode 273a in a pixel where the switching thin film transistor SW is connected to the infrared ray sensing thin film transistor IR. The third drain electrode 275c is also connected to the second source electrode 273b in a pixel where the switching thin film transistor SW is connected to the visible ray sensing thin film transistor VIS.

The switching thin film transistor SW may further include a lower gate electrode 224 that is formed on the substrate 210 and is disposed below the third semiconductor layer 250c, and a second insulating layer 240 that is formed on the lower gate electrode 224.

Contact holes may be formed in the second insulating layer 240 and the fourth insulating layer 280 to expose the lower gate electrode 224. In this case, the third upper gate electrode 294c is connected to the lower gate electrode 224 through one such contact hole.

Next, a bandpass filter 214 of an optical sensor according to an exemplary embodiment of the present invention will be described with reference to FIGS. 3 to 9. The bandpass filter 214 according to the present exemplary embodiment may be formed by forming a pattern of features, such as holes, material particles or other uniformity variations, on a metal layer so that light of a specific wavelength may be selectively transmitted therethrough, such that it may use a surface plasmon phenomenon to filter light.

The surface plasmon phenomenon means that when light falls incident on a metal surface having a nano-scale periodic pattern, light of a specific wavelength is formed by a resonance between light of a specific wavelength and free electrons of the metal surface. Incident light of the specific wavelength that can form the plasmon transmits through the holes, but the rest of the incident light is reflected from the metal surface.

The bandpass filter 214 may transmit only predetermined light by adjusting a pattern period of the linear pattern based on the plasmon characteristic, such that light in the infrared region may be separated.

Figure 3:
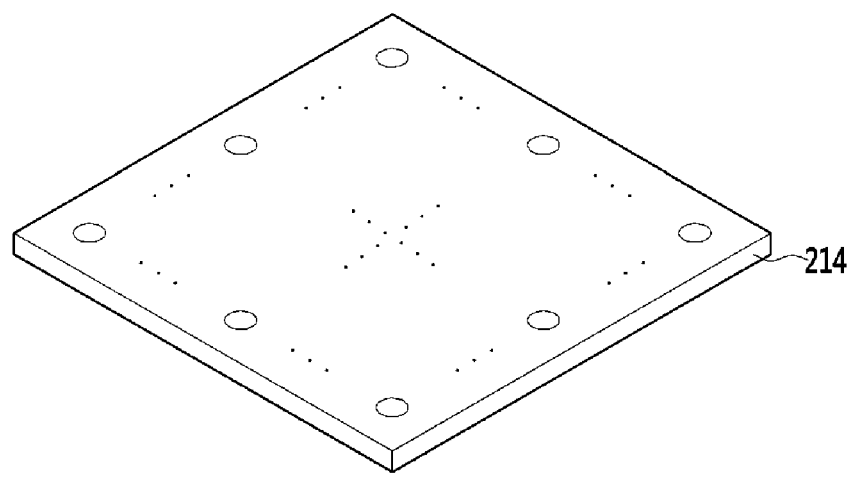
FIGS. 3 to 9 are isometric views illustrating bandpass filters of optical sensors according to various exemplary embodiments of the present invention.

FIG. 3 is a drawing illustrating the bandpass filter 214 of the optical sensor according to exemplary embodiments of the present invention. The bandpass filter 214 according to the present exemplary embodiment may be formed by including a plurality of holes in a metal layer. The metal layer may be formed of aluminum, molybdenum, copper, gold, silver, chromium, and the like, but it is not limited thereto.

The wavelength of transmitted light is about 1.7 to about 2 times an interval of the linear pattern. Accordingly, the optical sensor according to the present exemplary embodiment may be formed so that an interval between adjacent holes is about 390 nm to about 460 nm. This allows the hole pattern to reflect light in the visible spectrum and transmit light of infrared frequencies of about 780 nm.

Figure 4:
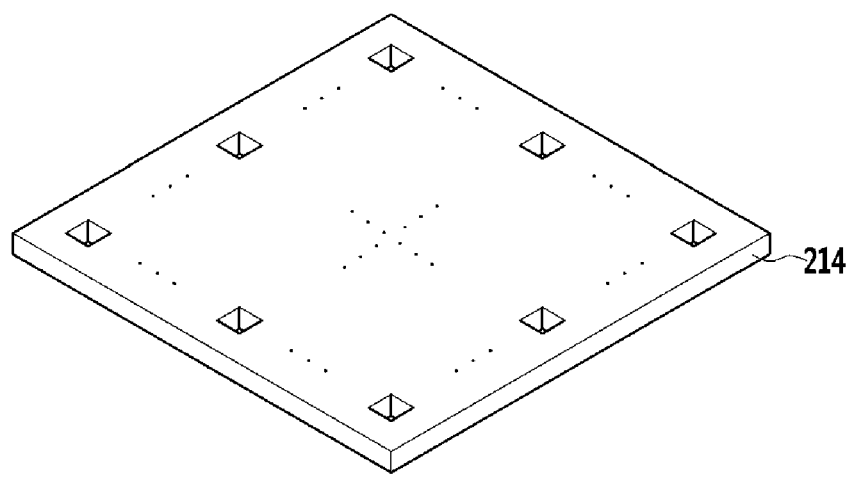
Figure 5:
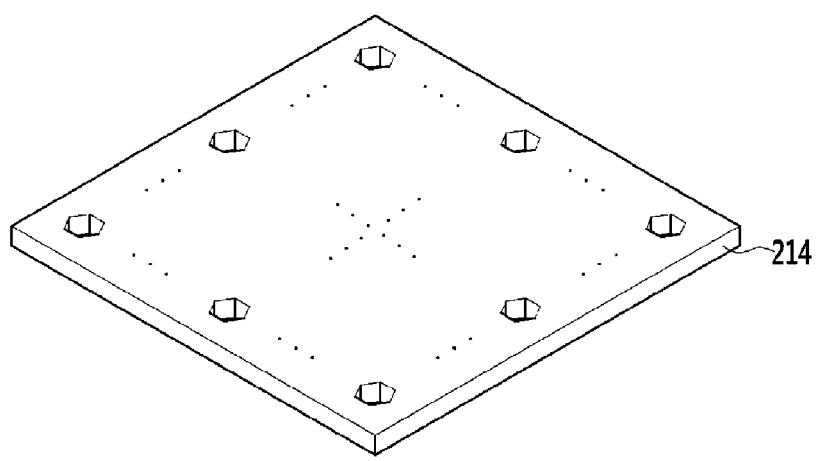
Figure 6:
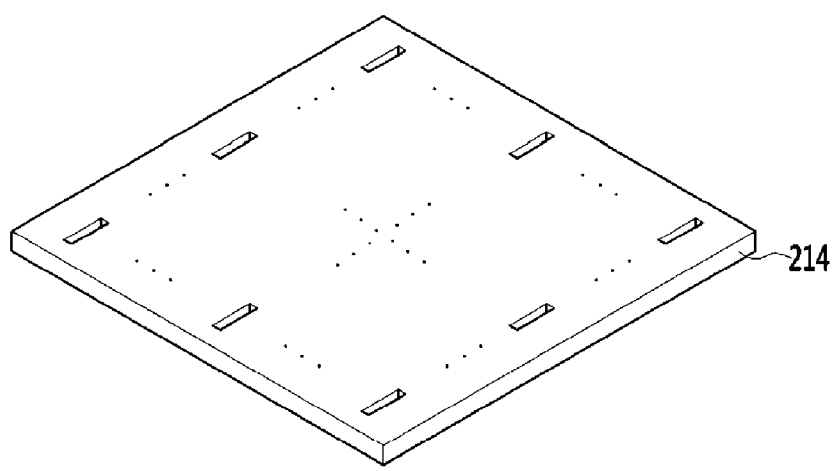

Further, the plurality of holes formed on the metal layer, as shown in FIGS. 4 to 6, may have various shapes, such as a quadrangle, a polygon, a slit, and the like.

Figure 7:
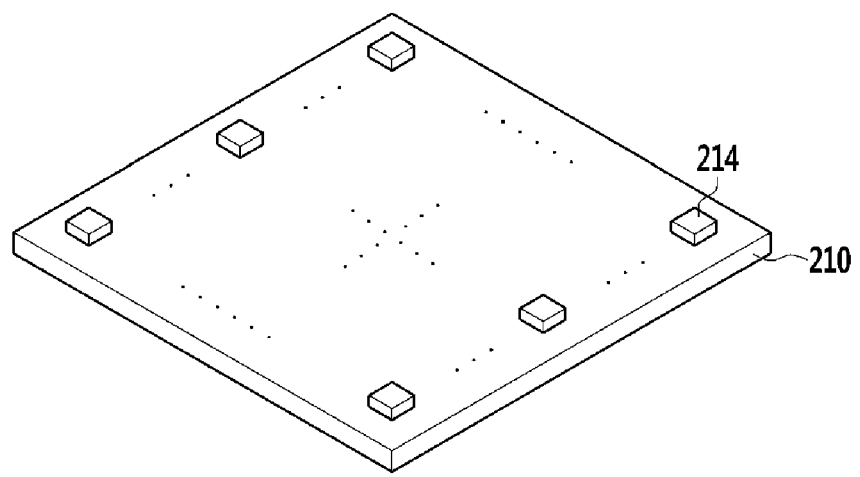
Figure 8:
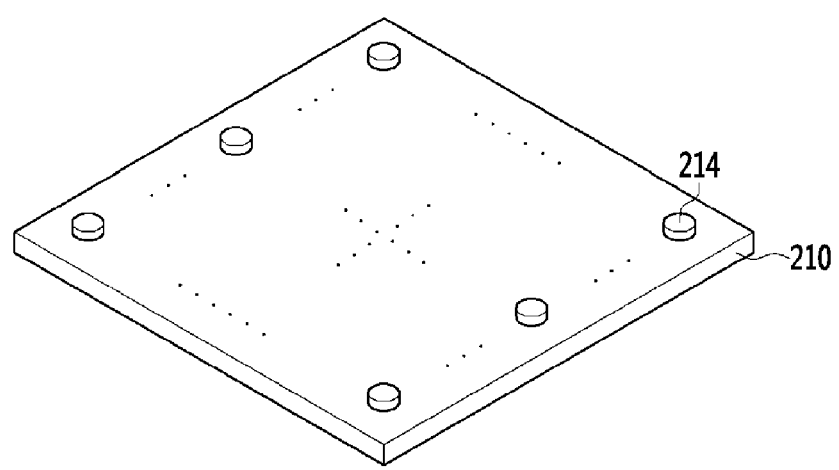
Figure 9:
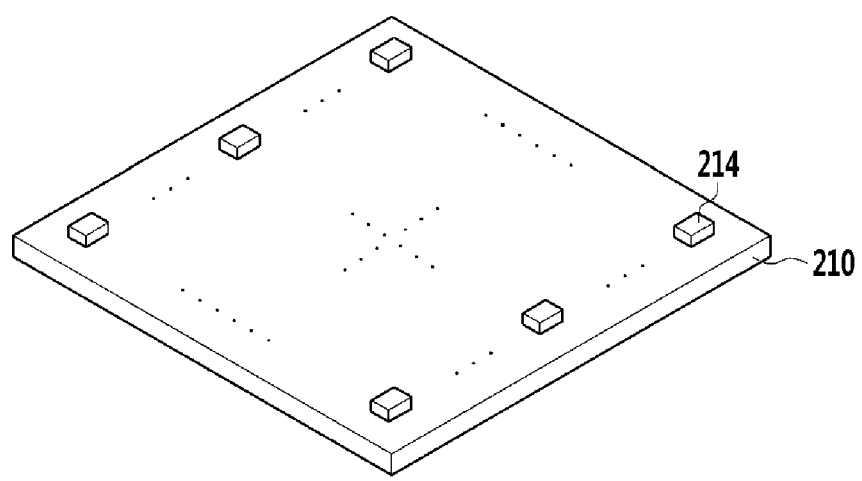

FIG. 7 is a drawing illustrating a bandpass filter of an optical sensor according to another exemplary embodiment of the present invention. The bandpass filter 214 according to the present exemplary embodiment may be formed by arranging rod-shaped metal particles or bar-shaped metal particles on the substrate 210. The metal particles may be aluminum, molybdenum, copper, gold, silver, chromium, and the like, but are not limited thereto. In addition, the metal particles may be of various shapes, such as a square as shown in FIG. 7, or circles or rectangles as shown in FIGS. 8 and 9, respectively.

In this case, the wavelength of the transmitted light is about 1.7 to about 2 times an interval of the linear pattern. Accordingly, the optical sensor according to the present exemplary embodiment may be formed for an interval between adjacent particles to be about 390 nm to about 460 nm so that it can reflect light in the visible ray range and transmit light in the infrared range, e.g. approximately 780 nm.

As a result, by forming the bandpass filter below the thin film transistor semiconductor layer for sensing infrared rays, the optical sensor according to the present exemplary embodiment may prevent visible rays from being incident thereto, thereby preventing a malfunction thereof.

Further, by forming the bandpass filter with a plurality of holes that are formed on the metal layer, and by adjusting the interval between holes and the shapes of the holes, the optical sensor according to the present exemplary embodiment may perform more accurate filtering than a filter that simply uses the properties of a material.

Next, a method of manufacturing optical sensors according to an exemplary embodiment of the present invention will be described with reference to the accompanying drawings.

FIGS. 10A to 10F are cross-sectional views illustrating a method of manufacturing an optical sensor according to an exemplary embodiment of the present invention.

First, as shown in FIG. 10A, a first insulating layer (not shown), a bandpass filter 214, and a lower gate electrode 224 are formed on a substrate 210 made of a material such as transparent glass or plastic.

The first insulating layer (not shown) may be formed of a lithium fluoride (LiF), a silicon nitride (SiNx), or the like, and it serves to improve adherence between the substrate 210 and the bandpass filter 214.

Next, the bandpass filter 214 and the lower gate electrode 224 are formed.

The bandpass filter 214 is a layer that prevents visible rays from falling incident upon other components, as described above. According to the present exemplary embodiment, the bandpass filter 214 may be formed by forming a linear pattern on a metal layer so that light of a specific wavelength may be selectively transmitted therethrough, i.e. so that only light of an infrared wavelength may pass therethrough.

In this case, the linear pattern of the bandpass filter 214 may be formed by forming a plurality of holes on the metal layer, or arranging metal particles on the metal layer. The metal layer or the metal particles may be aluminum, molybdenum, copper, gold, silver, chromium, and the like. An interval between adjacent holes formed on the metal layer and/or an interval between adjacent metal particles may be about 390 nm to about 460 nm.

The plurality of holes may be formed in the bandpass filter 214 by forming a photosensitive film pattern by selectively patterning through a photolithography process after forming a predetermined photosensitive film on the metal layer, and then by selectively patterning a metal layer below the photosensitive film pattern using the photosensitive film pattern as a mask.

Alternatively, the plurality of holes may be formed in the bandpass filter 214 by forming a predetermined resist on the metal layer, imprinting this resist layer with a molded-type roller, and then selectively patterning a metal layer below the predetermined resist pattern using the resist pattern as a mask.

The lower gate electrode 224 may be formed of the same conductive material as that of the bandpass filter 214, and it may be patterned by the same mask as that of the bandpass filter 214.

In this manner, the optical sensor according to the present exemplary embodiment may simplify manufacturing processes and may reduce manufacturing costs by forming the bandpass filter and the lower gate electrode on the same surface and by forming the bandpass filter and the lower gate electrode with the same material.

Further, the optical sensor according to the present exemplary embodiment may perform more accurate filtering than a filter that simply uses the properties of a material, by forming the bandpass filter including a plurality of holes formed on the metal layer and by adjusting the interval between the holes and the shape of the holes.

Figure 10B:
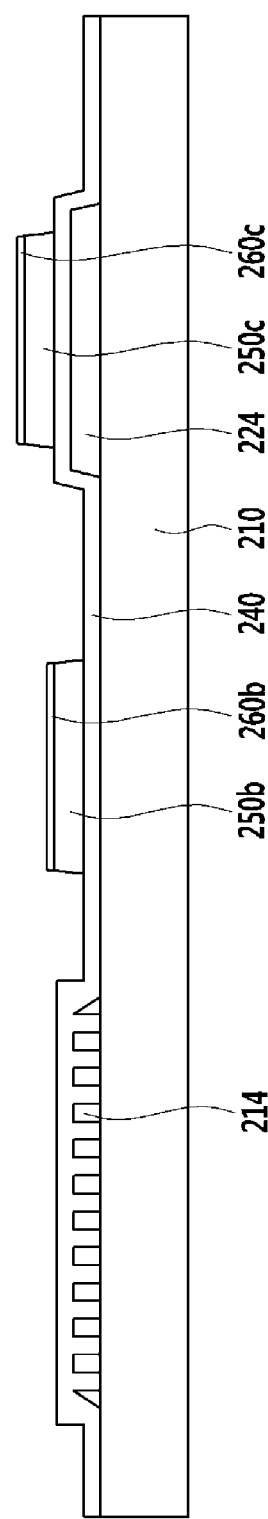

As shown in FIG. 10B, a second insulating layer 240 is formed on a front surface of the substrate 210 that includes the first insulating layer (not shown), the bandpass filter 214, and the lower gate electrode 224. A second semiconductor layer 250b and a second ohmic contact layer 260b are stacked and formed on the substrate 210, and a third semiconductor layer 250c and a third ohmic contact layer 260c are stacked and formed on the lower gate electrode 224.

The second semiconductor layer 250b and the third semiconductor layer 250c may be formed of the same material, e.g., amorphous silicon (a-Si). Amorphous silicon (a-Si) is a material that has high quantum efficiency in a visible ray region, and even though infrared light is incident thereto along with visible light, the material has high sensitivity in the visible ray region. Alternatively, the second semiconductor layer 250b and the third semiconductor layer 250c may be formed of other materials besides amorphous silicon (a-Si), and in particular they may be formed of any material that has high quantum efficiency in the visible light spectrum.

The second ohmic contact layer 260b and the third ohmic contact layer 260c may be formed of the same material.

Figure 10C:
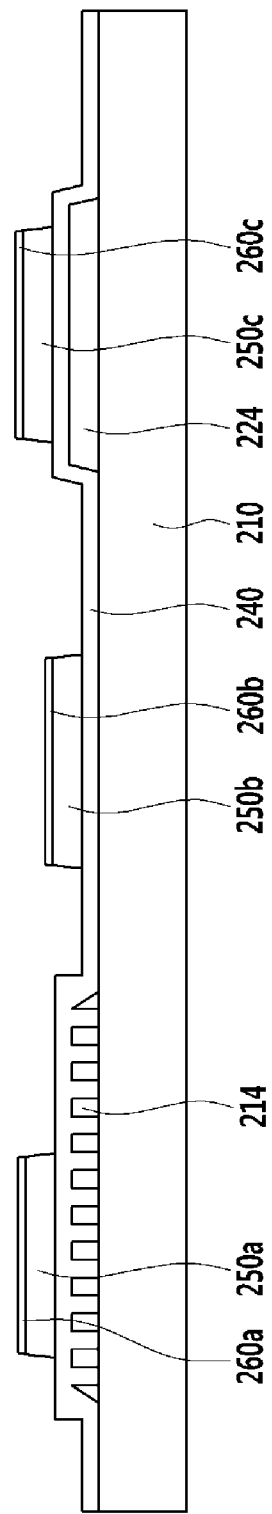

As shown in FIG. 10C, a first semiconductor layer 250a and a first ohmic contact layer 260a are formed on the bandpass filter 214. The first semiconductor layer 250a may be formed of a material such as amorphous silicon germanium (a-SiGe). Amorphous silicon germanium (a-SiGe) has high sensitivity to infrared rays as it is a material that has high quantum efficiency in the infrared spectrum. The first semiconductor layer 250a may be formed of other materials than amorphous silicon germanium (a-SiGe), and for example may be formed of any material that has high quantum efficiency in the infrared spectrum.

Figure 10D:
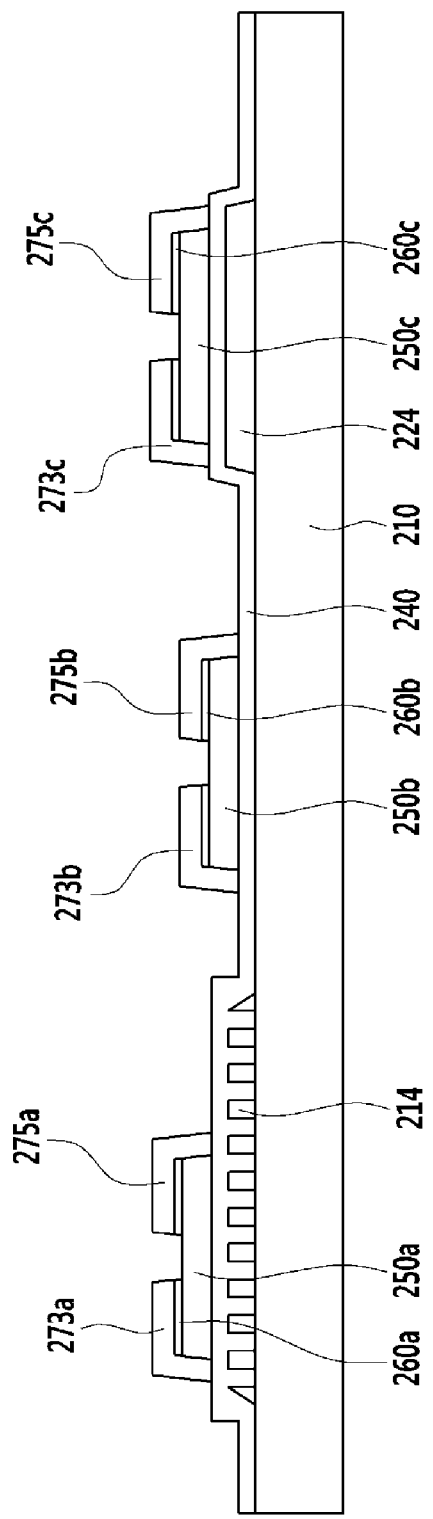

As shown in FIG. 10D, a first source electrode 273a and a first drain electrode 275a are formed on the first ohmic contact layer 260a, a second source electrode 273b and a second drain electrode 275b are formed on the second ohmic contact layer 260b, and a third source electrode 273c and a third drain electrode 275c are formed on the third ohmic contact layer 260c.

The first source and drain electrodes 273a and 275a, the second source and drain electrodes 273b and 275b, and the third source and drain electrodes 273c and 275c are respectively spaced apart from each other to form channels. In this case, the first ohmic contact layer 260a, the second ohmic contact layer 260b, the third ohmic contact layer 260c are removed from areas corresponding to their respective channels.

As shown in FIG. 10E, a fourth insulating layer 280 is formed on a front surface of the substrate 210 that includes the first source electrode 273a, the first drain electrode 275a, the second source electrode 273b, the second drain electrode 275b, the third source electrode 273c, and third drain electrode 275c.

Next, a contact hole 281 is formed in the second insulating layer 240 and the fourth insulating layer 280 to expose bandpass filter 214.

Figure 10F:
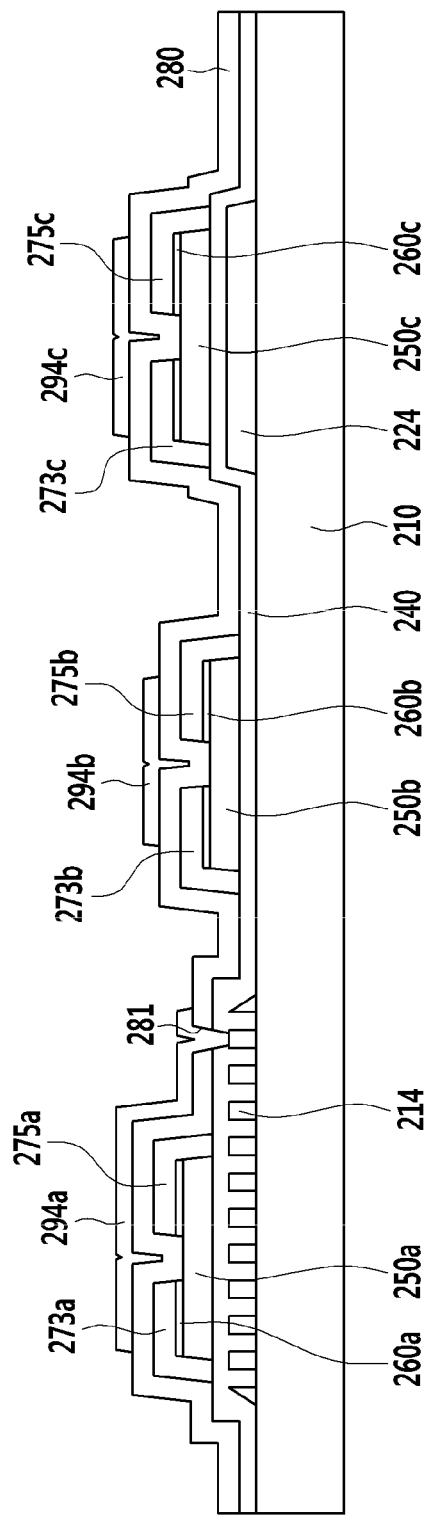

As shown in FIG. 10F, a first upper gate electrode 294a is formed on the fourth insulating layer 280 to correspond to the first source electrode 273a and the first drain electrode 275a, a second lower gate electrode 294b is formed on the fourth insulating layer 280 to correspond to the second source electrode 273b and the second drain electrode 275b, and a third upper gate electrode 294c is formed on the fourth insulating layer 280 to correspond to the third source electrode 273c and the third drain electrode 275c.

The first upper gate electrode 294a is connected to the bandpass filter 214 through the contact hole 281.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Various features of the above described and other embodiments can be mixed and matched in any manner, to produce further embodiments consistent with the invention.

<Description of symbols>

| | |
|---|---|
| 210: substrate | 214: bandpass filter |
| 221: gate line | 224: lower gate electrode |
| 240: second insulating layer | 242: third insulating layer |
| 250a: first semiconductor layer | 250b: second semiconductor layer |
| 250c: third semiconductor layer | 260a: first ohmic contact layer |
| 260b: second ohmic contact layer | 260c: third ohmic contact layer |
| 273a: first source electrode | 273b: second source electrode |
| 273c: third source electrode | 275a: first drain electrode |
| 275b: second drain electrode | 275c: third drain electrode |
| 280: fourth insulating layer | 281: contact hole |
| 294a: first upper gate electrode | 294b: second upper gate electrode |
| 294c: third upper gate electrode | |

What is claimed is:

1. An optical sensor, comprising:
a substrate;
an infrared ray sensing thin film transistor including a first semiconductor layer over the substrate so that the infrared ray sensing thin film transistor is arranged to operate by receiving infrared light, and a bandpass filter formed on the substrate and sized and arranged to pass the infrared light;
a visible ray sensing thin film transistor including a second semiconductor layer over the substrate so that the visible ray sensing thin film transistor is arranged to operate by receiving visible light; and
a switching thin film transistor including a third semiconductor layer and a lower gate electrode overlapping the third semiconductor layer over the substrate
wherein the bandpass filter comprises a patterned metal material, patterns of the metal material of the bandpass filter are spaced apart from each other by a predetermined period to block the visible light, and the lower gate electrode comprises the same metal material and is at the same layer as the bandpass filter; and
wherein the infrared ray sensing thin film transistor further comprises:
a first source electrode and a first drain electrode formed over the first semiconductor layer;
an insulating layer over the first source electrode and the first drain electrode and at least a portion of the metal material of the bandpass filter, the insulating layer having a contact hole on the metal material of the bandpass filter; and
a first upper gate electrode over the insulating layer is connected directly to the metal material of the bandpass filter through the contact hole.

2. The optical sensor of claim 1, wherein
the bandpass filter comprises holes formed in the metal material.

3. The optical sensor of claim 2, wherein
the metal material comprises at least one among aluminum, molybdenum, copper, gold, silver, or chromium,
a shape of a hole of the holes is one of a circle, a quadrangle, a polygon, and a slit, and
adjacent holes are spaced apart from each other by the predetermined period, the predetermined period having a length of about 390 nm to about 460 nm.

4. The optical sensor of claim 1, wherein
the bandpass filter comprises metal particles.

5. The optical sensor of claim 4, wherein
the metal particles comprise at least one among aluminum, molybdenum, copper, gold, silver, and chromium,
a shape of a metal particle of the metal particles is one of a circle, a square, and a rectangle, and
adjacent metal particles are spaced apart from each other by about 390 nm to about 460 nm.

6. The optical sensor of claim 1, wherein
the first semiconductor layer includes amorphous silicon germanium.

7. The optical sensor of claim 1, wherein the infrared ray sensing thin film transistor further includes:
an ohmic contact layer between the first semiconductor layer and at least one of the first source electrode and the first drain electrode.

8. The optical sensor of claim 1, wherein
the second semiconductor layer and the third semiconductor layer include amorphous silicon.

9. The optical sensor of claim 1, wherein the visible ray sensing thin film transistor includes:
an ohmic contact layer over the second semiconductor layer;
a second source electrode and a second drain electrode over the ohmic contact layer;
the insulating layer over the second source electrode and the second drain electrode; and
a second upper gate electrode over the insulating layer.

10. The optical sensor of claim 1, wherein the switching thin film transistor includes:
a first insulating layer over the lower gate electrode;
an ohmic contact layer over the third semiconductor layer;

a third source electrode and a third drain electrode over the ohmic contact layer;
a second insulating layer over the third source electrode and the third drain electrode; and
a third upper gate electrode over the second insulating layer.

* * * * *